United States Patent
Diasparra et al.

(10) Patent No.: US 10,033,363 B2
(45) Date of Patent: Jul. 24, 2018

(54) METHOD FOR SYNCHRONOUSLY DISTRIBUTING A DIGITAL SIGNAL OVER N IDENTICAL ADJACENT BLOCKS OF AN INTEGRATED CIRCUIT

(71) Applicant: Teledyne e2v Semiconductors SAS, Saint Egreve (FR)

(72) Inventors: Bruno Diasparra, Seyssins (FR); Frédéric Barbier, Fontanil-Cornillon (FR)

(73) Assignee: TELEDYNE E2V SEMICONDUCTORS SAS, Saint Egreve (FR)

( * ) Notice: Subject to any disclaimer, the term of this patent is extended or adjusted under 35 U.S.C. 154(b) by 0 days.

(21) Appl. No.: 15/534,524

(22) PCT Filed: Dec. 8, 2015

(86) PCT No.: PCT/EP2015/078994
§ 371 (c)(1),
(2) Date: Jun. 9, 2017

(87) PCT Pub. No.: WO2016/091886
PCT Pub. Date: Jun. 16, 2016

(65) Prior Publication Data
US 2017/0331468 A1  Nov. 16, 2017

(30) Foreign Application Priority Data
Dec. 11, 2014 (FR) .................................. 14 62253

(51) Int. Cl.
*H03K 5/15* (2006.01)

(52) U.S. Cl.
CPC ................... *H03K 5/1508* (2013.01)

(58) Field of Classification Search
CPC ......................................... H03K 5/1508
See application file for complete search history.

(56) References Cited

U.S. PATENT DOCUMENTS 6,874,097 B1    3/2005  Aliahmad et al.
9,245,825 B2 *  1/2016  Ramachandra .......... G11C 8/12
(Continued)

OTHER PUBLICATIONS

International Search Report and Written Opinion for PCT/EP2015/078994, dated Mar. 21, 2016.

*Primary Examiner* — Jeffrey Zweizig
(74) *Attorney, Agent, or Firm* — Pilloff & Passino LLP

(57) ABSTRACT

The invention proposes a method for distributing a signal to each block $B_j$ of a series of N adjacent blocks of identical design in an electronic circuit. It proposes, in an identical fashion for each of the N blocks, placing a timing delay circuit MUX-$DEL_j$ on the path for conveying a signal $S_c$ from the input $INc_j$ of the block to an internal electrical node $Nd_j$ of the block for this signal $S_c$; providing for the timing delay circuit to supply N delayed signals corresponding to N different timing delays $\Delta f_1, \ldots \Delta f_j, \ldots \Delta f_N$ separated by an increment of elementary duration $\Delta t$ that corresponds to the elementary delay $\Delta t$ for transit of a block introduced into a conductive line; and selecting the delayed signal corresponding to the applicable timing delay according to the block in question, by means of an index signal propagated through the N blocks, and which is incremented or decremented on passage through each block.

12 Claims, 5 Drawing Sheets

(56) References Cited

U.S. PATENT DOCUMENTS

2004/0019817 A1  1/2004  Dahlgren et al.
2005/0278675 A1  12/2005  Johnson

* cited by examiner

METHOD FOR SYNCHRONOUSLY DISTRIBUTING A DIGITAL SIGNAL OVER N IDENTICAL ADJACENT BLOCKS OF AN INTEGRATED CIRCUIT

FIELD

The invention concerns the distribution of electrical, more particularly digital, signals in large-dimension integrated semiconductor circuits. It applies notably to large-dimension image sensors.

CONTEXT

The fabrication of integrated semiconductor circuits uses lithographic, more particularly photolithographic, techniques in order to produce the various levels (layers) of the circuit. Each level has a corresponding mask.

The maximum size of a circuit that it is possible to produce in one exposure is fixed by the maximum size of the exposure field of a mask, which maximum size is fixed by the size of the reticle, in the order of 24 mm over 30 mm, using current techniques.

In order to produce circuits of larger size, a lithographic technique called mask coupling is used, allowing coverage of the whole of the surface of the circuit that is to be produced. This therefore involves breaking down the blueprint of the circuit into a plurality of elementary pieces; each elementary piece has a corresponding set of lithographic masks. When the circuit comprises a plurality of identical elementary pieces, a single set of masks is used, by repositioning it as many times as there are identical replicas to be produced in succession, along a rectangular axis of the circuit.

This technique is notably applied to the production of large-dimension image sensors, such as those used in the field of industrial vision or aerospace. Notably, the matrix of photodetection pixels of a large-dimension sensor lends itself to such breakdown into identical elementary pieces. In the remainder of the document, the notion of an elementary block, or more simply "block", is used, which must be understood in the sense of a blueprint ("design") for a given electronic function, that is to say an identified piece of a circuit, with identified signal inputs and signal outputs, which are respectively signal outputs and inputs of other elementary blocks, which will be connected to one another in the course of production of the blocks, using the photolithographic technique called mask coupling.

As a reminder, an electronic circuit takes up a substantially rectangular surface area on a semiconductor circuit board. The breakdown of the circuit into elementary blocks is effected along the rectangular axes of this surface area. Photographic repetition of masks is realized along one and/or the other of these two axes and the various blueprints (design) of the elementary blocks of the circuit are marked along the two rectangular axes. A block has a corresponding blueprint that translates into a set of lithographic masks, one mask per production step of the circuit. Each block is likewise part of a rectangular surface area marked on the circuit board, and the maximum size of this rectangle corresponds to that of the reticle that is used.

FIG. 1 shows an example of a breakdown for a large-dimension circuit into elementary blocks, along an axis x of the circuit. Successively from left to right in the plane of the sheet, it is possible to see a block A, a succession of N identical blocks B and another block C. By way of example, taking the example of an image sensor again, the blocks B can correspond to sets of photodetection cells (pixels) of the matrix and the peripheral blocks A and C on each side can correspond to functions for supplying digital control or addressing signals to the pixels. The masks are defined with an area of coverage between successive blocks in order to ensure continuity for the conductors on which the signals travel from one block to another. These aspects are well known to a person skilled in the art.

The problem arising in this context for a large-dimension circuit is that a digital signal that is applied to each of the N identical blocks, by means of a conductive line transiting these N blocks, will not arrive on each of these N blocks at the same time, owing to the time constant of the conductive line, because of the length thereof.

FIG. 1 shows a signal $S_c$ that is supplied by the block A and applied to each of the N blocks B by means of an electrical distribution line Lc, which is arranged parallel to the axis x. It is possible to see another signal $S_c'$ supplied by the block C and applied to the N blocks B by means of another electrical distribution line Lc'.

The signal $S_c$ propagates in the direction X; it first arrives at the input of the first block B, which it transits, and then at the input of the second block B, which it transits, and so on until it arrives at the input of the N-th block B. In each block, the signal $S_c$ received at an input of the block is conveyed to an internal electrical node of the block, which is provided for this signal. This conveyance of the signal from the input of the block to the internal node is shown by an arrow in the figure. $\Delta t$ is used to denote the elementary time for transit through a block B, from the input of the block B to the input of the next block B; furthermore, $\Delta i$ is used to denote the elementary time for conveyance of the signal from the signal input $S_c$ to the internal node of the block. These elementary times are known intrinsic times that are dependent only on the time constant and the length of the lines for distributing and conveying a signal to a block. It is therefore possible to determine the moment at which the signal $S_c$ arrives on the internal node of each of the blocks, in relation to an instant $t_0$ at which this signal arrives at the input of the first block. More precisely and with reference to FIGS. 2 and 3, $B_j$ is used to denote the block of rank j in the succession of N blocks, moving from left to right, with j an integer varying from 1 to N; $INc_j$ is used to denote the point of input on this block $B_j$ for the line Lc distributing the signal $S_c$; and $Nd_j$ is used to denote the internal node of the block $B_j$ to which the signal $S_c$ is conveyed. Furthermore, $t_0$ is used to denote the instant of arrival of the signal $S_c$ at the point of input $INc_1$ of the block $B_1$.

At the point of input $INc_j$, the signal $S_c$ shows a delay, in relation to the instant $t_0$, which is equal to (j−1) times $\Delta t$ (transit through the previous j−1 blocks), plus $\Delta i$ (journey between $INc_j$ and $Nd_j$). In this delay, the $\Delta t$ component is not negligible in view of the clock period of the circuit. By way of example, for a length of line Lc between the inputs of two consecutive identical blocks equal to 20 mm (corresponds to the width of a block), the associated elementary time $\Delta t$ can amount to 5 nanoseconds using current technologies. In a circuit operating at a clock frequency of 50 megahertz, the cumulative delay for the signal $S_c$ at the input of the fifth block will be of the order of one clock period, in relation to the instant $t_0$ of arrival at the first block. In the case of N=5 consecutive identical blocks or more, the signal $S_c$ does not arrive in the N blocks in the same clock period.

Thus, in a large-dimension circuit, which can comprise at least 8 to 10 consecutive identical blocks, the delay along the distribution line for a succession of N identical elementary blocks is not negligible in view of the operating clock frequency of the circuit and poses a problem with regard to synchronization of the signals/processing operations of these blocks.

PROBLEM

The object of the invention is to solve this synchronization problem.

The problem is twofold: it can be seen that the various identical elementary blocks receive a digital signal simultaneously, that is to say in the same clock period; moreover, said signal is obtained in each of the N identical blocks by means of a delay management circuit that preserves their identical nature.

This problem concerns both the case of the distribution of a digital signal such as the signal $S_c$ in FIGS. 1 and 2, which has the requirement to be applied to each of the N consecutive blocks simultaneously, and that of the distribution of N digital signals, each of which require to be applied to a respective block of the succession of N blocks, but at the same instant in the N blocks. The first case can correspond to a digital signal controlling the operation of the blocks, such as the signals for controlling the various phases of initialization, integration, transfer and reading of the pixels of an image sensor; furthermore, there is the requirement for these signals to arrive at each of the blocks of the succession all at the same time; furthermore, the second case can correspond to digital signals that are data; furthermore, there is a requirement for these data each to be taken into account or processed by a respective block of the succession of N blocks, but at the same moment in these N blocks.

SUMMARY

The time constant associated with the line Lc for distributing the signal $S_c$ brings about tiering, that is to say an offset, that is regular, at intervals of $\Delta t$, for the moment of application to the internal node of the N identical blocks of the succession, which is illustrated in FIG. 4. If $t_0$ is the instant of reception of the signal $S_c$ at the input $INc_1$ of the block $B_1$: this signal is received at the internal node $Nd_1$ of this block $B_1$ at $t_1 = \Delta i$; it is received a time period $\Delta t$ later, or at $t2 = t_1 + \Delta t = \Delta i + \Delta t$, at the internal node $Nd_2$ of the next block $B_2$; it is received at the internal node $Nd_j$ of the block $B_j$ at the instant $t_j = \Delta i + (j-1)\Delta t$; it is received at the internal node $Nd_N$ of the block $B_N$ at the instant $t_N = \Delta i + (N-1)\Delta t$.

In the invention, it is desirable to get away from this tiering. There is a requirement for the signal $S_c$ to be applied to all the internal nodes at the same time, at the instant $t_f$. It is a matter of delaying the timing of the application of the signal to the internal nodes at least until the last block has itself been able to receive the signal at the internal node. However, it is a matter of realizing this timing delay in each of the N identical blocks while preserving the identical nature of the blueprint of the N blocks. That is to say that the timing delay circuit needs to be able to be realized in or for each block, by means of photographic repetition of the same single set of masks. To overcome this technical problem, the invention cleverly proposes replacing the elementary time $\Delta i$ for conveying the signal to the internal node, inside each block, which is a time that is intrinsic to the circuit, and negligible in view of the operating frequency of the circuit, with a determined time, which is imposed by a timing delay circuit placed on the path for conveying the signal from the input of the block to the internal node of the block; providing for the timing delay circuit to supply N delayed signals corresponding to N different timing delays separated by an increment of elementary duration $\Delta t$; and selecting the delay signal corresponding to the applicable timing delay according to the block in question, by means of an index signal propagated through the N blocks, and which is incremented or decremented on passage through each block.

The timing delay circuit designed according to the invention is thus applied to each of the blocks whatever its rank: it is the value of the index in the block under consideration that will single out the output of the timing delay circuit of this block. Typically, the block $B_1$ will have the longest timing delay of the signal $S_c$; the block $B_N$ will have the shortest timing delay of the signal $S_c$.

This timing delay circuit can thus be realized for each of the N blocks $B_j$ using the same set of masks. This set of masks may, in practice, be the one defined for the block B itself when the timing delay circuit is integrated in the circuit of the block B; alternatively, a unique set of masks when the timing delay circuit forms part of the definition of another elementary circuit block, for example a block that groups together the plurality of timing delay circuits in order to delay the timing of the plurality of signals to be distributed to the blocks B. The invention also concerns a method for distributing a digital signal to each of the blocks of an aligned succession of N identical adjacent blocks of an electronic circuit, by means of conductive signal lines transiting the N blocks along the alignment axis of the blocks, the transit through each of the N blocks introducing an elementary delay $\Delta t$, and a corresponding electronic circuit. The invention is characterized by an automatic indexing of the blocks by means of propagation of an index signal through the N blocks, with incrementation or decrementation of the index value on passage through each block, said automatic indexing setting a respective index value for each of the N blocks of the succession, a signal timing delay applied to the input of each block, between a conductive line for a signal and an internal electrical node for application of said signal, and the applied timing delay time is selected by means of the index value set for this block, from N different timing delay times separated by an increment of elementary duration $\Delta t$ that corresponds to the elementary delay $\Delta t$ for transit of a block introduced into a conductive line, and this timing delay is implemented by means of one timing delay circuit per block, which is identical for each block, that is connected between the input and the internal node of the block, and that comprises N delay circuits in order to supply the N timing delay times, said delay circuits each being connected between the input of the block and a respective input channel of a multiplexer having N input channels and one output channel, said output channel being connected to the internal node of the block, and said index value set for the block being applied to the multiplexer as an input channel selection input, said method being such that for any j, j an integer from 1 to N, a digital signal transmitted by a respective conductive line and received at the input of the j-th block of the succession after having transited the j−1 previous blocks of the succession, is applied to the internal node of this block with a timing delay that is greater by $\Delta t$ than the corresponding timing delay in the (j+1)-th block or less by $\Delta t$ than the corresponding timing delay in the (j−1)-th block.

When applied to the distribution of M digital signals, M an integer at least equal to 1, where each of the M digital signals is distributed to a corresponding internal electrical node in each of the N blocks of the succession, M identical timing delay circuits are provided in each of the N blocks, receiving the index signal selecting a delay from N delays.

When applied to the distribution of N digital signals by N conductive lines transiting the N blocks of the succession, where each of the N digital signals is applied to an internal electrical node of a single respective block of the succession of N blocks, there is moreover provision for a routing of the N signals inside each block, which is identical for each block, between N input pads and N output pads of the block, the routing input and output pads of the same rank being aligned on the N blocks, and the N output pads of a block being connected to the N input pads of the next block, correspondingly, said routing inside each block being such that:
- a first input pad of the block is connected to the input of a timing delay circuit of the block;
- the other N−1 input pads of the block are connected to the first N−1 output pads of the block, such that the input pad having the rank k, where k=2 to N, is connected to the output pad of rank k−1; and
- the N-th routing output pad of the block is referenced to an internal voltage reference.

In one implementation of the invention, the index signal is incremented by one unit on passage through each block when it is propagated in the same direction as the digital signal(s), or decremented by one unit when it is propagated in the opposite direction.

BRIEF DESCRIPTION OF THE DRAWINGS

Other features and advantages of the invention are presented in the description that follows, with reference to the appended drawings, in which.

DETAILED DESCRIPTION

The invention provides, for each block, a timing delay circuit for a digital signal, of identical design for each block. The circuit is designed to delay the instant of application, to a corresponding internal node, of a signal received at the input of the block by a determined time, which is dependent on the rank of the block in the succession of N identical blocks. The expression "internal node" signifies the point of application of this signal to an element of this block, at which the signal triggers or produces a corresponding expected effect (case of a control signal); or else which processes this signal (case of a data signal).

Figure 5:
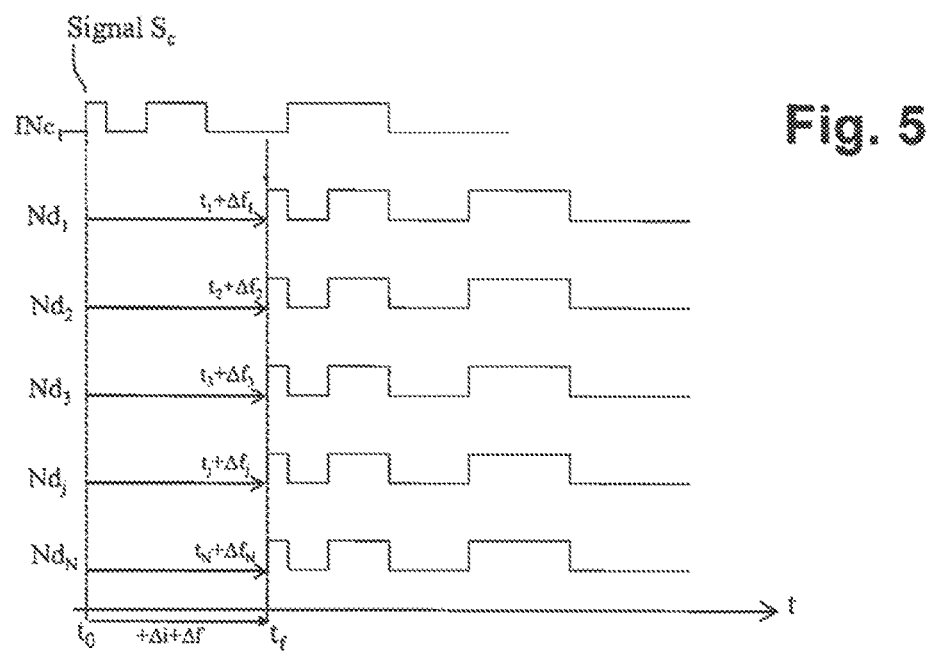
FIG. 5 is a timing diagram illustrating the principle of timing delay according to the invention allowing synchronization of the instant of reception of the signal $S_c$ in the N blocks.

FIG. 5 provides a simplified illustration of the operation of the timing delay circuit according to the invention, by means of which the signal $S_c$ arrives at the internal node $Nd_j$ of each of the N blocks of the succession at the same instant $t_f$. This instant $t_f$ is equal to $t_0+\Delta i+\Delta f$, that is to say that the signal $S_c$ arrives at all the internal nodes with one and the same delay $\Delta i+\Delta f$ in relation to the instant $t_0$ at which the signal arrives at the input of the first block, while furthermore preserving the identical nature of the N blocks.

According to the invention, the timing delay circuit is designed to impose in each of the N blocks an additional delay whose duration is modular, according to the rank j of the block in the succession of N blocks and according to the intrinsic elementary time $\Delta t$ for transit through a block. $\Delta f_j$ is used to denote this modular timing delay time, according to the rank of the block. For N identical blocks, there are N different timing delay times $\Delta f_1, \ldots \Delta f_j \ldots \Delta f_N$, and these times are separated by an increment of elementary duration $\Delta t$ that corresponds to the elementary delay $\Delta t$ for transit through a block introduced into a conductive line.

The invention is described in more detail below, taking as an example an implementation in which the timing delay circuit is designed to deliberately delay the arrival of the signal $S_c$ at the internal node of the block $B_j$ of rank j by a time $\Delta f_j$ that is equal to (N−j+1) times the intrinsic elementary time period $\Delta t$.

Figure 3:
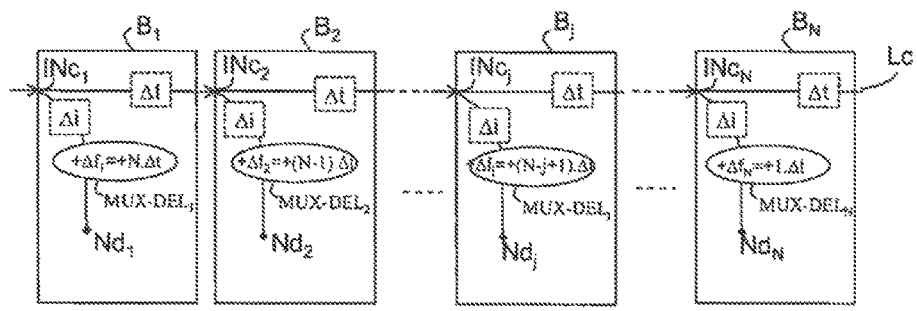
FIG. 3 illustrates the principle according to the invention for the timing delay of the application of the signal inside each block according to the rank of the block.
Figure 4:
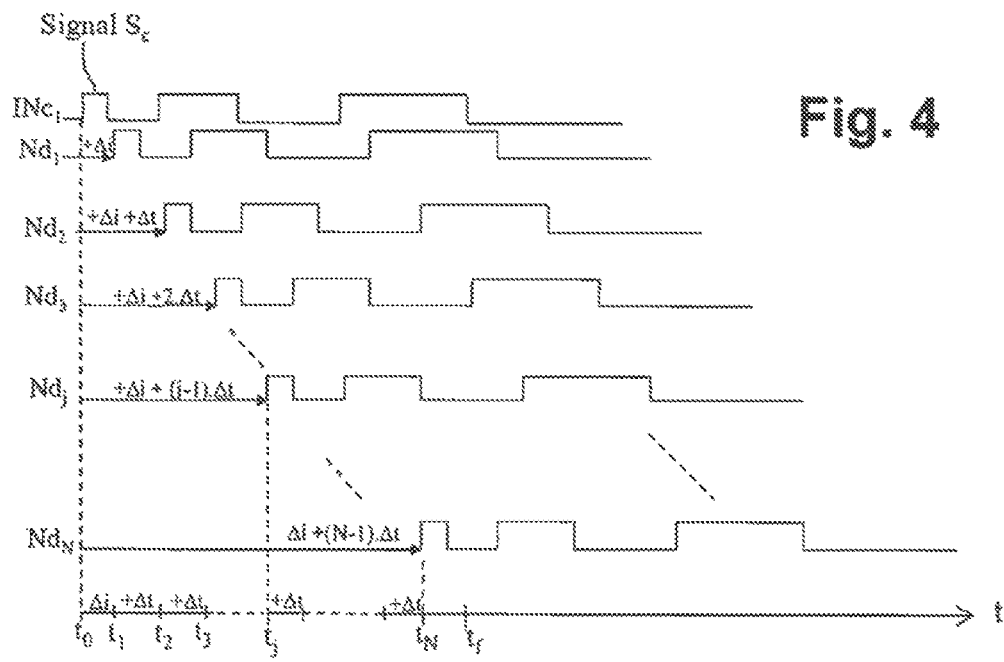
FIG. 4 is a timing diagram illustrating the timing offset for the instants of reception of a signal $S_c$ distributed to the succession of N identical blocks in FIG. 1.

FIG. 3 illustrates the effect, in each block $B_j$, of a timing delay circuit for the corresponding signal $S_c$, according to the rank j of the block under consideration: in the first block of rank 1 (j=1), the timing delay circuit MUX-DEL$_1$ adds a time period $\Delta f_1$ equal to N·$\Delta t$. In the block of rank j, the timing delay circuit MUX-DEL$_j$ adds a time period $\Delta f_j$ equal to (N−j+1)·$\Delta t$. In the block of rank N (j=N), the timing delay circuit MUX-DEL$_N$ adds a time period $\Delta f_N$ equal to 1·$\Delta t$.

Finally, the signal $S_c$ arrives at all the nodes $Nd_1$, $Nd_2, \ldots Nd_N$ at the same instant $t_f$ (FIGS. 3 and 5).

To this modular delay deliberately imposed in each of the blocks by the timing delay circuit of the invention is added an "intrinsic" internal delay, linked to the characteristics of the conducting line elements before and/or after the timing delay circuit, or between the circuit elements making up the timing delay circuit. So as not to multiply the references, this intrinsic delay will continue to be denoted by $\Delta i$; the duration of this intrinsic delay $\Delta i$ remains negligible in view of the intrinsic time $\Delta t$ for transit through a block and hence a fortiori in view of the deliberate modular delay $\Delta f_j$ added by the timing delay circuit, which is a multiple of $\Delta t$.

Figure 6:
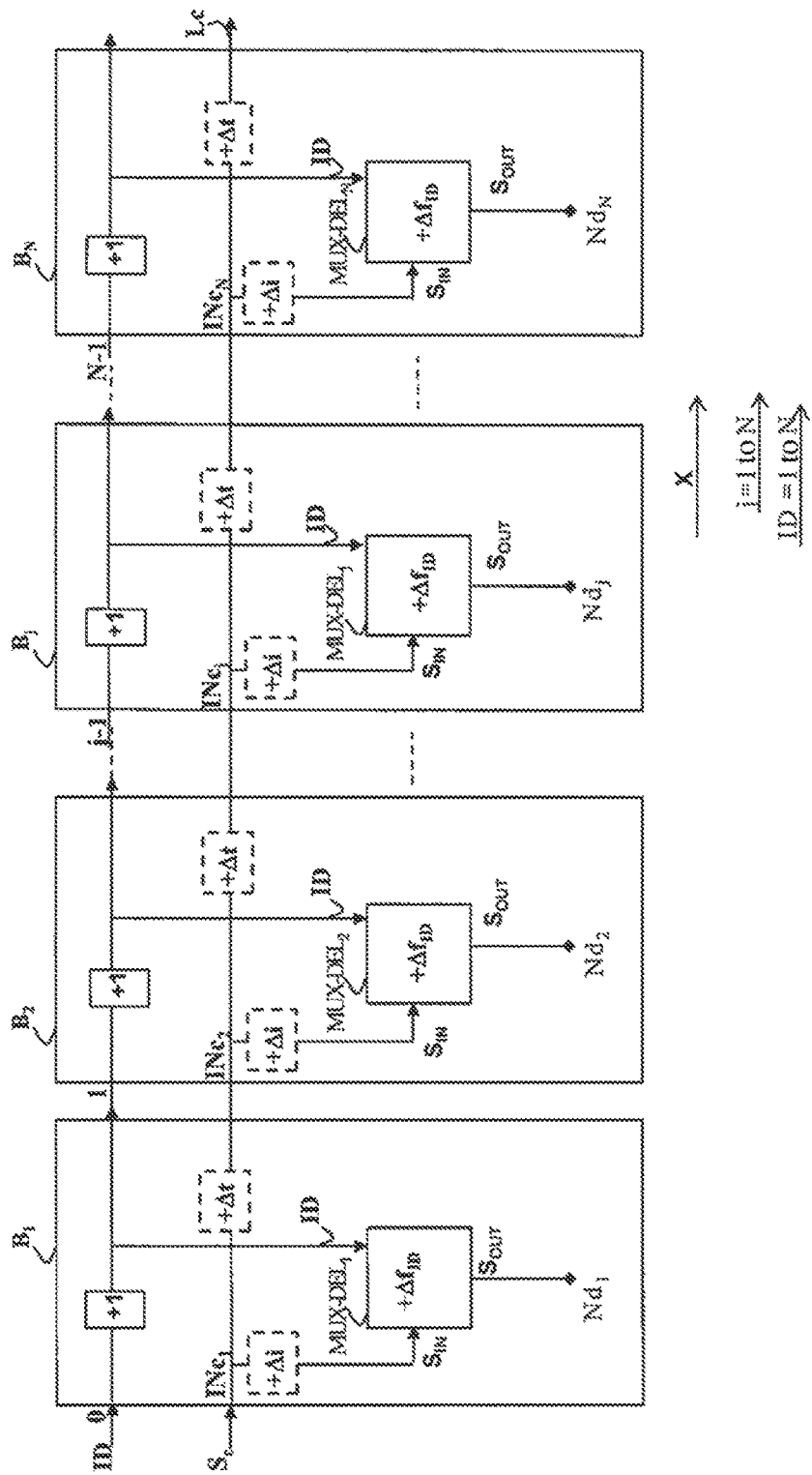
FIG. 6 illustrates a succession of N identical blocks each integrating a signal timing delay circuit according to the invention.
Figure 7:
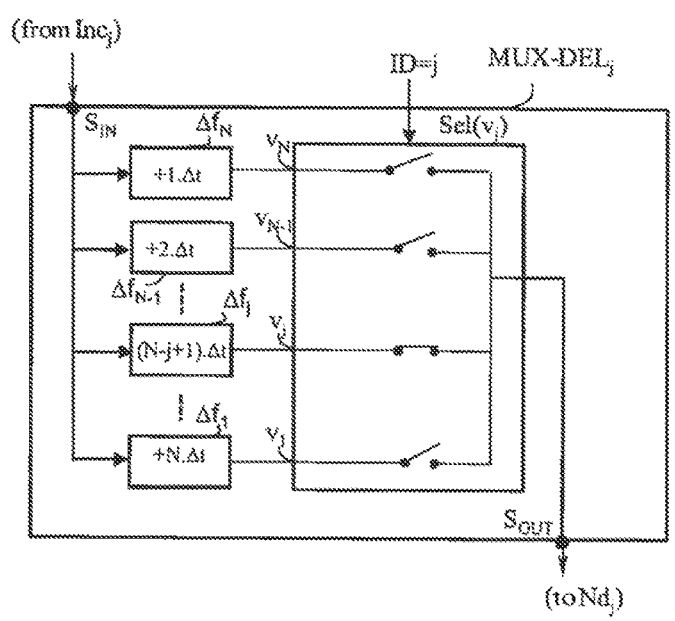
FIG. 7 details a timing delay circuit according to the invention.

A timing delay circuit according to the invention is now described with reference to FIGS. 6 and 7. $\Delta f_{ID}$ is used to denote the modular delay added by the timing delay circuit in the block in question, and ID is used to denote an index signal that is propagated through the N blocks while being incremented or being decremented on passage through each block depending on whether the index propagates in the same direction as the signal to which the timing delay is applied or in the opposite direction. In FIGS. 6 and 7, the index signal ID is propagated in the same direction as the signal $S_c$; it is incremented by one unit (+1) in each block, for example by means of an adder.

The index signal is a digital datum encoded over a few bits. If the number N of blocks of the succession is equal to 10, 4 bits are sufficient. This signal is represented by one distribution line in the figures; in practice, however, this line comprises as many conductors as there are data bits. This index signal is applied to the first block with an initial value. In the example, this initial value is zero (0). This value is incremented at the input of the block and it is this incremented value that is applied to the selection input $Sel(v_t)$ of the timing delay circuit of the block and that is transmitted to the input of the next block. Thus, with the conventions retained in this example, the index value ID that is used for selection of the modular delay in the timing delay circuit varies from 1 to N, like the rank j of the block, in the direction of propagation of the signal $S_c$.

The index signal ID is set on (for) all the blocks in order to allow selection of the applicable delay in each block. By way of example, this setting of the index signal is realized during an initialization phase of the electronic circuit.

One implementation of the invention is more particularly explained with reference to FIGS. 6 and 7, with the notation conventions and propagation direction conventions that are indicated above. Other implementations based on other conventions are possible, without departing from the scope of the invention. By way of example, the index value received at the input of the block can be applied as a selection input to the timing delay circuit of the block, and the incremented value of this index can be transmitted to the next block. In this case, the value ID used as a selection varies from 0 to N−1. It is also possible for the index value to be propagated in the opposite direction from propagation of the signal. A corresponding example will be given later on.

Let us review FIGS. 6 and 7, therefore. A timing delay circuit according to the invention is embedded in each of the N blocks of the succession. There are thus N circuits, denoted by $MUX\text{-}DEL_j$, with j an integer varying from 1 to N, all strictly identical, produced (able to be produced) from the same set of photolithographic masks.

The timing delay circuit $MUX\text{-}DEL_j$ according to the invention comprises (FIG. 7) N delay circuits in parallel and a multiplexer having N input channels to one output channel; the output of each delay circuit is connected to a respective input channel of the multiplexer. Furthermore, the timing delay circuit has two inputs and a signal output interfaced with the block:

- a signal input, $S_{IN}$, connected to the input $INc_j$ of the block, by means of which the signal $S_c$ is applied to the input of the N delay circuits;
- a selection input denoted by $Sel(v_j)$, allowing selection of the input channel of the multiplexer to be connected to the output channel of the multiplexer; this input $Sel(v_j)$ receives the index signal ID;
- a signal output $S_{out}$, which corresponds to the output channel of the multiplexer, which output channel is connected to the internal node $Nd_j$ of the block, which is the node for application of the signal $S_c$ in the block.

The N delay circuits are each respectively configured to delay the signal $S_c$ received at the input of the block by a different time, in the example respectively once, twice, . . . j times, . . . N times the elementary time $\Delta t$ for transit through a block.

These N delay circuits are each arranged between the signal input $INc_j$ of the block and a respective channel from the N input channels v1, v2, . . . $v_N$ of the multiplexer. These delay circuits are each produced in practice by an analogue delay line, by cascaded inverters, or else by RC networks, designed in an appropriate manner in order to obtain the desired modular delay.

According to the invention, the index signal ID applied as a channel selection signal $Sel(v_j)$ to the input of the multiplexer allows selection, in each block, of the input channel of the multiplexer that corresponds to the timing delay that needs to be applied to the signal $S_c$ received at the input of the block under consideration, according to the rank j of the block, in relation to the direction of propagation of the signal $S_c$ on the N blocks (with j increasing from 1 to N in the direction of propagation of the signal $S_c$). In the example, the timing delay applied by the timing delay circuit of the block of rank j is equal to $(N-j+1)$ times $\Delta t$.

In the implementation example illustrated in FIGS. 6 and 7, the useful value of the index signal ID (the one applied as selection input $Sel(v_j)$) varies like j, that is to say from 1 to N, in the direction of propagation of the signal $S_c$. In the example, $v_1, \ldots v_N$ is used to denote the N input channels of the multiplexer; $v_1$ corresponds to the channel having the longest delay, with a timing delay imposed by the corresponding delay circuit, in this case equal to $+N\cdot\Delta t$, and $v_N$ corresponds to the channel having the shortest delay, with a timing delay imposed by the corresponding delay circuit, in this case equal to $+\Delta t$. For the block of rank j, the index signal ID is set to the value j on the selection input $Sel(v_j)$ of the circuit $MUX\text{-}DEL_j$, which selects the channel $v_j$, supplying a signal delayed by a time that is in this case equal to $+(N-j+1)+\Delta t$.

If the index signal is set in the N blocks starting from block N, that is to say by virtue of propagation in the opposite direction from the signal $S_c$; on this assumption, the index signal is propagated while being decremented by one unit in each block, from an initial value, for example equal to N. The input channels of the multiplexer would then be connected to the outputs of the N delay circuits in the opposite order from the one that is illustrated in FIG. 7: the $1^{st}$ channel $v_1$ would correspond to the shortest delay, $+1\cdot\Delta t$, and the N-th channel $v_N$ to the longest delay, $+N\cdot\Delta t$, in order to allow selection of the appropriate input channel to be applied to the output $S_{out}$ of the circuit according to the index signal.

These practical considerations for implementation according to the initial value of the index signal, the direction of propagation of the signal, the inclusion before or after incrementation or decrementation, and in consideration of the addresses of the N input channels of the multiplexer are usual variants for a person skilled in the art. Thus, the invention is not limited to the implementations that are more particularly illustrated.

Figure 1:
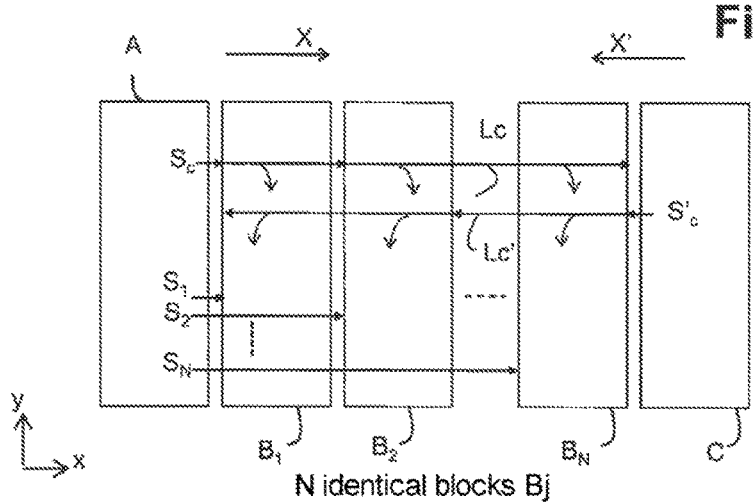
FIG. 1, which has already been described, schematically shows a breakdown for a circuit piece into a row of successive blocks, comprising a succession of N identical blocks between two peripheral blocks.
Figure 2:
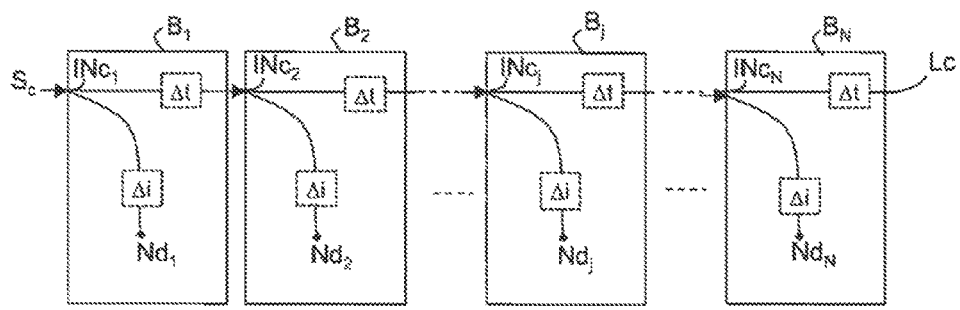
FIG. 2, which has already been described, illustrates the intrinsic elementary times $\Delta t$, for transit of a block, and $\Delta i$, for conveyance of a signal to an internal node of the block.

In all cases notably, an index signal is supplied having an initial value, for example by a peripheral block such as the block A or C in FIG. 1, and propagated on the N blocks for a digital circuit, an adder or subtractor, that is provided in each of the N blocks, allowing setting of the corresponding useful index value for each of these N blocks.

Figure 8:
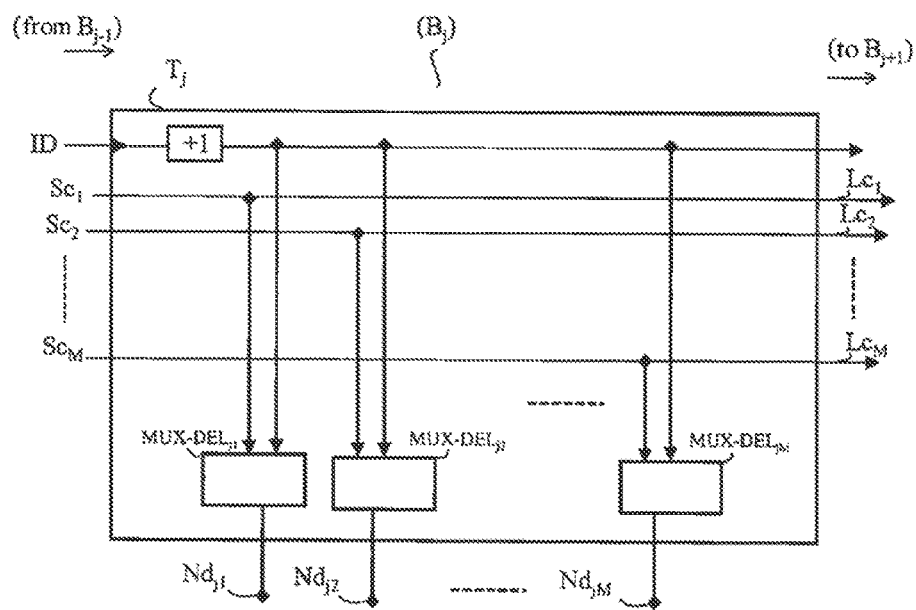
FIG. 8 illustrates an application of the invention to the timing delay of a plurality of different signals that each need to be applied to each of the N blocks simultaneously.

FIG. 8 illustrates an application of the invention to the timing delay of a plurality of separate signals, for example signals for controlling various operational phases of the blocks; each one distributed by a respective distribution line, in the same direction of propagation X, to the N blocks of the succession; and each one applied to a respective internal node in each of the N blocks. In the example, the M signals $Sc_1, Sc_2, \ldots Sc_M$ are each distributed by a respective line $Lc_1, Lc_2, \ldots Lc_M$, to each of the N blocks of the succession.

According to the invention, each block $B_j$ is provided with a timing delay stage $T_j$ that comprises as many identical timing delay circuits as there are different signals to be applied internally. In the example, each timing delay stage $T_j$ comprises M timing delay circuits denoted by MUX-$DEL_{j1}$, ... MUX-$DEL_{jM}$ that are all controlled by the same index signal ID; each one receives one of the M signals received at the input of a block, and supplies a corresponding signal having delayed timing at the output, and a corresponding internal node of the block ($Nd_{j1}$, $Nd_{j2}$, ... $Nd_{jM}$).

In this case, the invention allows each of the various phases controlled by the various control signals to be activated at the same time in each block.

Figure 9:
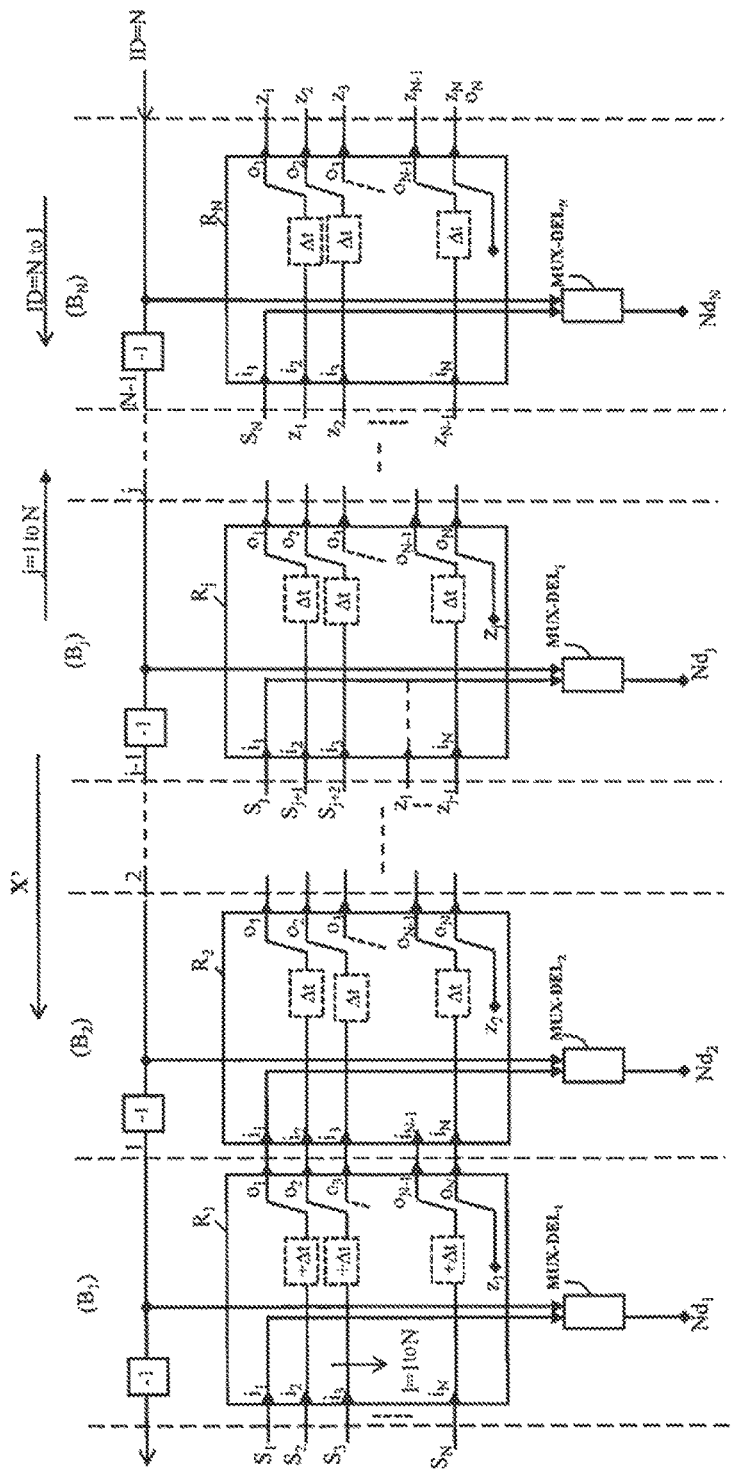
FIG. 9 illustrates another application of the invention, to the timing delay of N different signals, each signal needing to be applied to a respective block from the N identical blocks of the succession at the same moment.

FIG. 9 illustrates another example of application of the invention. In this case, N different signals are to be distributed, in the same direction of propagation, of each one to a single block. In this case, there is a requirement for these N signals to be taken into account or processed in their respective block at the same instant $t_f$ (in the same period). By way of example, these N signals are data signals that themselves leave N identical circuit blocks, for example N pixel blocks of an image sensor. The aim in this case is to synchronize the processing of these N data signals, in N identical data processing blocks.

There is thus provision for one signal timing delay circuit per block; the N timing delay circuits all receive the index signal ID, propagated with decrementation from one block to the next, and are activated by this signal in order to select the delay comprising the multiple of Δt that suits each block.

There is moreover provision for an internal routing circuit for the N signals in each block, having N input pads $i_1$ to $i_N$ and N output pads $o_1$ to $o_N$, and the routing circuit is identical whatever the block: the pattern of the lines of the connections connecting the N input pads and the N output pads are identical. More precisely:

Each input pad is aligned with the output pad of the same rank, in the direction X of propagation of the signal. Each of the N output pads of the routing circuit of a block is connected to the input pad of the same rank of the routing circuit of the next block. The ranks of the pads vary in this case along the axis orthogonal to the axis of propagation of the signal. In the example, the rank of the pads increases along the axis Y oriented toward the bottom of the sheet. It could vary in the opposite direction.

The signal received on the first input pad $i_1$, of rank 1, is routed to the timing delay circuit of the block in question; the signals received on the second, third, ..., k-th, ... N-th input pad of the switching circuit are routed to the first, second, third, ... (k−1)-th, ... (N−1)-th output pad, respectively, of the routing circuit of the block. The N-th output pad of the routing circuit is connected to a voltage reference, typically the earth, which constitutes a first artificial signal $z_1$ that will be propagated from block to block, moving by one input pad rank in each block, so as finally to be applied to the first input pad of the routing circuit $R_N$ of the last block, $B_N$. In each block, a new artificial signal is generated and applied to the last output pad $o_N$ of the routing circuit in question. In practice, in this example, the routing of the signal received on the first input pad $i_1$ to the timing delay circuit is performed on a different conductor level of the circuit from the conductor level on which the other routing operations are performed.

Considering the block $B_j$ of rank j: the routing circuit $R_j$ of the block $B_j$ receives the signal $S_j$, which is intended for the internal node $Nd_N$ of this block, on the first input pad $i_1$ and applies it to the timing delay circuit MUX-$DEL_j$; it receives the (N−j) signals that remain to be distributed, $S_{j+1}$ to $S_N$, on the respective input pads $i_2$ to $i_{N-j+1}$, which it routes to the output pads $o_1$ to $o_{N-j}$, respectively; it receives j−1 artificial signals $z_1$ to $z_{j-1}$ on the remaining input pads $i_{N-j+2}$ to $i_N$, which it routes to the output pads $o_{N-j+1}$ to $o_{n-1}$, respectively; it generates a j-th artificial signal $z_j$ that it conveys to the output pad $o_N$.

The routing circuit $R_N$ of the last block thus receives, on the first input pad $i_1$, the signal $S_N$ intended for the internal node $Nd_N$ of this block, and it receives N artificial signals $z_1$ to $z_{N-1}$ on the other input pads $i_2$ to $i_N$. It supplies N artificial signals at $z_1$ to $z_N$ to the outputs $o_1$ to $o_N$.

The combination of such a routing circuit having a timing delay circuit, which are identical whatever the block, with an index signal ID according to the invention therefore allows simultaneous, and synchronous, application of a different signal to each of the N blocks of the succession.

It will be noted that, in the example of FIG. 9, the example of an index signal ID propagated in the opposite direction from the signals $S_1$ to $S_N$ has been illustrated. In the example, it has an initial value that is set to N at the input of the block $B_N$, and is decremented on passage through each block. There could be provision for direct propagation with incrementation of the index as in FIG. 6.

This incrementation (or decrementation) of the index signal is realized, by way of example, by means of an adder (a subtractor). In another nonlimiting example, a multiplexing table encoded with the N possible index values at the inputs is used, and such as the index value ID received by the block, selects as output value from the table the index value with the desired increment or decrement from the N available values.

Finally, for practical reasons, in the whole of the description above it is considered that the delay set by the timing delay circuit of the block of last rank is Δt. This delay could be zero, or indeed any, however, provided that the delay of the previous block differs by Δt in relation to the last block, and that the delay of any block ($B_j$) differs by +Δt in relation to the delay of the next block ($B_{j+1}$) and by −Δt in relation to the delay of the previous block ($B_{j-1}$).

The invention for which a few examples of implementation and application have just been described applies quite particularly to large-size circuits, produced using mask coupling techniques, for which one or more pieces of the blueprint can be divided into a succession of identical blocks along one of the rectangular axes of the circuit. It allows clever automatic synchronization of the moments at which the signals are applied to internal nodes of these blocks, while preserving their identical nature.

The invention claimed is:

1. A method for distributing a digital signal to each of the blocks of an aligned succession of N identical adjacent blocks of an electronic circuit, by means of conductive signal lines transiting the N blocks along the alignment axis of the blocks, the transit through each of the N blocks introducing an elementary delay Δt, wherein the method comprises an automatic indexing of the blocks by means of propagation of an index signal through the N blocks, with incrementation or decrementation of an index value of said index signal on passage through each block, said automatic indexing setting a respective index value for each of the N blocks of the succession, a signal timing delay applied to the input of each block, between a conductive line for a signal and an internal electrical node for application of said signal, and the applied timing delay time is selected by means of the index value set for this block, from N different timing delay times separated by an increment of elementary duration Δt that corresponds to the elementary delay Δt for transit of a block introduced into a conductive line, and in that this timing delay is implemented by means of one timing delay circuit per block, which is identical for each block, that is connected between the input and the internal node of the block, and that comprises N delay circuits in order to supply the N timing delay times, said delay circuits each being connected between the input of the block and a respective input channel of a multiplexer having N input channels and one output channel, said output channel being connected to the internal node of the block, and said index value set for the block being applied to the multiplexer as an input channel selection input, said method being such that for any j, j an integer from 1 to N, a digital signal transmitted by a respective conductive line and received at the input of the j-th block of the succession after having transited the j−1 previous blocks of the succession, is applied to the internal node of this block with a timing delay that is greater by Δt than the corresponding timing delay in the (j+1)-th block or less by Δt than the corresponding timing delay in the (j−1)-th block.

2. The distribution method of claim 1, applied to the distribution of M digital signals, M an integer at least equal to 1, where each of the M digital signals is distributed to a corresponding internal electrical node in each of the N blocks of the succession, wherein the timing delay of each of the M digital signals in each of the N blocks of the succession is provided by M identical timing delay circuits in each of the N blocks, receiving the index signal selecting a delay from N delays.

3. The distribution method of claim 1, applied to the distribution of N digital signals by N conductive lines transiting the N blocks of the succession, where each of the N digital signals is applied to an internal electrical node of a single respective block of the succession of N blocks, characterized in that it moreover comprises a routing of the N signals inside each block, which is identical for each block, between N input pads $i_1$ to $i_N$ and N output pads $o_1$ to $o_N$ of the block, the routing input and output pads of the same rank being aligned on the N blocks, and the N output pads of a block being connected to the N input pads of the next block, correspondingly, said routing inside each block being such that:
 a first input pad of the block is connected to the input of a timing delay circuit of the block;
 the other N−1 input pads of the block are connected to the first N−1 output pads of the block such that the input pad having the rank k, where k=2 to N, is connected to the output pad of rank k−1; and
 the N-th routing output pad of the block is referenced to an internal voltage reference.

4. The distribution method of claim 1, in which the index signal is incremented by one unit on passage through each block when it is propagated in the same direction as the digital signal(s), or decremented by one unit when it is propagated in the opposite direction.

5. The distribution method of claim 2, in which the index signal is incremented by one unit on passage through each block when it is propagated in the same direction as the digital signal(s), or decremented by one unit when it is propagated in the opposite direction.

6. The distribution method of claim 3, in which the index signal is incremented by one unit on passage through each block when it is propagated in the same direction as the digital signal(s), or decremented by one unit when it is propagated in the opposite direction.

7. An electronic circuit having at least one aligned succession of N identical adjacent blocks and one or more conductive lines transiting the N blocks along the alignment axis of the blocks, which allow application of at least one digital signal to an input of each of the N blocks of the succession for the purpose of transmitting this signal to a respective internal electrical node of the block, characterized in that each block comprises
 an index signal input for receiving an index signal and propagating it through the N blocks, with incrementation or decrementation of an index value of the index signal on passage through the block, in order to set a respective index value for each of the N blocks of the succession,
 one signal timing delay circuit per block, which is identical for each block, and connected between the input of the block and the internal electrical node of the block, the timing delay circuit comprising N delay circuits in order to supply a series of N different timing delay times separated by an increment of elementary duration Δt that corresponds to the elementary delay Δt for transit of a block introduced into a conductive line,
the N delay circuits each being connected between the input of the block and a respective input channel of a multiplexer having N input channels and one output channel, said output channel being connected to the internal node of the block, and said index value set for the block being applied to the multiplexer as an input channel selection input, in order to select a delay from N,
such that, for a block of rank j in the succession of blocks, j an integer, equal to 1 to N, a digital signal transmitted by a respective conductive line and received at the input of this block after having transited the j−1 previous blocks of the succession, is applied to the internal node of this block with a delay incremented by Δt in relation to the delay applied in the block of next rank j+1 or decremented by Δt in relation to the delay applied in the block of previous rank j−1.

8. The electronic circuit of claim 7, comprising M conductive lines transporting M different digital signals through the N blocks of the succession, which are applied to M internal electrical nodes in each of the N blocks of the succession, through M identical timing delay circuits, and the M timing delay circuits in each of the N blocks receive the same index signal.

9. The electronic circuit of claim 7, in which the block receives N different digital signals from which a single signal of rank j needs to be applied to an internal electrical node of the block of rank j, by the timing delay circuit of the block, the block moreover comprising a circuit for routing the N digital signals inside each block, between N input pads $i_1$ to $i_N$ and N output pads $o_1$ to $o_N$, of the block, the routing input and output pads of the same rank being aligned on the N blocks, on each of the N output pads on a block being connected to the input pad of the same rank of the next block, the routing circuit being identical in each of the N blocks of the succession and such that:
 a first input pad of the block is connected to the input of a timing delay circuit of the block;
 the other N−1 input pads of the block are connected to the first N−1 output pads of the block, such that the input pad having the rank k, where k=2 to N, is connected to the output pad of rank k−1; and
 the N-th routing output pad of the block is referenced to an internal voltage reference.

10. The electronic circuit of claim 7, in which the N blocks of the succession comprise a circuit for incrementing the index signal, wherein this circuit is an incrementation circuit when the index signal is propagated in the same direction as the digital signal(s), and a decrementation circuit when it is propagated in the opposite direction.

11. The electronic circuit of claim 8, in which the N blocks of the succession comprise a circuit for incrementing the index signal, wherein this circuit is an incrementation circuit when the index signal is propagated in the same direction as the digital signal(s), and a decrementation circuit when it is propagated in the opposite direction.

12. The electronic circuit of claim 9, in which the N blocks of the succession comprise a circuit for incrementing the index signal, wherein this circuit is an incrementation circuit when the index signal is propagated in the same direction as the digital signal(s), and a decrementation circuit when it is propagated in the opposite direction.

* * * * *